US006827870B1

(12) United States Patent
Gianchandani et al.

(10) Patent No.: US 6,827,870 B1
(45) Date of Patent: Dec. 7, 2004

(54) METHOD AND APPARATUS FOR ETCHING AND DEPOSITION USING MICRO-PLASMAS

(75) Inventors: Yogesh B. Gianchandani, Madison, WI (US); Chester G. Wilson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 450 days.

(21) Appl. No.: 09/686,259

(22) Filed: Oct. 11, 2000

Related U.S. Application Data

(60) Provisional application No. 60/158,817, filed on Oct. 12, 1999.

(51) Int. Cl.$^7$ .......................... B44C 1/22; H01L 22/302; C23F 1/00
(52) U.S. Cl. ............... 216/71; 156/345.38; 156/345.45; 118/723 MP; 118/723 E
(58) Field of Search .................. 156/345.38, 345.45, 156/915, 345.1; 216/67, 71; 118/723 R, 723 MP, 723 E

(56) References Cited

U.S. PATENT DOCUMENTS

| | | | |
|---|---|---|---|
| 5,302,237 A | | 4/1994 | Larson et al. |
| 5,397,420 A | * | 3/1995 | Sakakibara ................. 156/345 |
| 5,688,415 A | | 11/1997 | Bollinger et al. |
| 5,811,021 A | * | 9/1998 | Zarowin et al. .............. 216/67 |

FOREIGN PATENT DOCUMENTS

DE  19826418 A1  12/1999

OTHER PUBLICATIONS

Q.–Y. Tong and U. Gösele, Semiconductor Wafer Bonding: Science and Technology (book), John Wiley & Sons, Inc., pp. 138–139.

C.A. Spindt, et al., "Physical properties of thin-filmed field emission cathodes with molybdenum cones," Journal of Applied Physics, vol. 47, No. 12, Dec. 1976, pp. 5248–5263.

Hiroshi Murakami, et al., "A Pulse Discharge Panel Display for Producing a Color TV Picture with High Luminance and Luminous Efficacy," IEEE Trans. on Electronic Devices, vol. ed. 29, Jun. 1982, pp. 988–994.

Toshihiro Yamamoto, et al., "A 40–Inch–Diagonal HDTV DC Plasma Display," IEEE Trans. on Electron Devices, vol. 42, No. 5, May 1995, pp. 847–855.

Kyung Cheol Choi, "Microdischarge in Microbridge Plasma Display with Holes in the Cathode," IEEE Electron Device Letters, vol. 19, No. 6, Jun. 1998, pp. 186–188.

Alan Sobel, "Television's Bright New Technology," Scientific American, May 1998, pp. 70–77.

Shahid Rauf, et al., "Operation of a Coplanar–Electrode Plasma Display Panel Cell," IEEE Trans. on Plasma Science, vol. 27, No. 1, Feb. 1999, pp. 10–11.

(List continued on next page.)

*Primary Examiner*—George A. Goudreau
(74) *Attorney, Agent, or Firm*—Foley & Lardner

(57) ABSTRACT

Plasma etching or deposition is performed over substrates using spatially localized micro-plasmas operating in parallel with each other. A plasma generating electrode is positioned closely adjacent to an exposed surface of the substrate, as on the surface of a dielectric layer applied to the substrate. A selected pressure of the gas in the region of the electrode and the substrate is established, and a voltage is applied between the plasma generating electrode and the substrate or a second electrode to ignite a plasma in the region between the plasma generating electrode and the substrate for a selected period of time. This plasma is limited to the region of the plasma generating electrode adjacent to the exposed surface so that the substrate is plasma treated in a desired pattern.

48 Claims, 9 Drawing Sheets

OTHER PUBLICATIONS

Jeff R. Gottschalk, et al., "Time–Resolved Electrical and Optical Measurements in a Plasma Display Panel," IEEE Trans. on Plasma Science, vol. 27, No. 3, Jun. 1999, pp. 772–777.

Jeffrey A. Hopwood, "A Microfabricated Inductively Coupled Plasma Generator," Journal of Microelectromechanical Systems, vol. 9, No. 3, Sep. 2000, pp. 309–313.

Q.Y. Tong and U. Gosele, Semiconductor Wafer Bonding: Science and Technology (Book), John Wiley & Sons, Inc., 1998, pp. 138–139.

B. Pashaie, et al., "Experimental Investigation of Microdischarges in a Dielectric–Barrier Discharge," IEEE Trans. on Plasma Science, vol. 27, No. 1, Feb. 1999, pp. 22–23.

* cited by examiner

METHOD AND APPARATUS FOR ETCHING AND DEPOSITION USING MICRO-PLASMAS

CROSS REFERENCE TO RELATED APPLICATION

This application claims the benefit of provisional application No. 60/158,817, filed Oct. 12, 1999, the disclosure of which is incorporated by reference.

FIELD OF THE INVENTION

This invention pertains generally to the fields of plasma processing and semiconductor manufacturing, and to plasma etching and deposition techniques.

BACKGROUND OF THE INVENTION

Plasmas are routinely used in the manufacturing of integrated circuits and inicroelectromechanical systems (MEMS). Such plasmas are used for etching of the semiconductor substrates and for the etching or depositing of thin films of materials on the substrates, e.g., films of polycrystalline silicon, silicon dioxide, silicon nitride and metals. The reactive plasmas may be excited in a gas in various ways, commonly by applying a voltage across two electrodes to establish an electric field between the electrodes in a gas at a low pressure. The spacing between the electrodes is typically a few centimeters. The gas is maintained at a pressure low enough such that a plasma is established at a voltage between the electrodes which is below that at which arcing between the electrodes will take place. One of the electrodes may comprise the workpiece on which etching or deposition will take place, while the other electrode may be the wall of the reactor. Typical operating pressures in the plasma chamber are in the range of 1–1000 millitorr, relatively low pressure levels that are necessary to avoid arcing during ignition of the plasma. The requirement for relatively low pressures necessitates the use of fairly expensive vacuum pumps, can require the use of load locks, and can limit the production speed because of the time required to pump down the plasma confinement chamber to the required pressure level.

Silicon etching in commercial plasma processing systems is commonly performed in parallel plate reactors by applying RF power (typically at 13.56 MHz) between two electrodes placed several centimeters apart. The silicon wafer is located on the powered electrode for reactive ion etching. The operating pressure and power are in the range of 10–500 mtorr and 10–500 mW/cm$^2$, respectively. Since the plasma exists globally across the wafer, the etch is selectively masked by a thin film of, e.g., photoresist, SiO$_2$ or metal, which is patterned on the wafer surface. More recently, fast anisotropic etches have been demonstrated by alternative plasma etchers utilizing electron cyclotron resonance (ECR) and inductively coupled plasmas (ICP). All of these options, however, employ a single plasma that acts over the entire surface area of a wafer. Creating several different etch depths or profiles in a single die mandates the use of a like number of masking steps.

A particular challenge in the use of reactive plasmas in semiconductor processing is the need to maintain spatial uniformity in etching or deposition over the entire surface of the semiconductor wafer. Commercial semiconductor wafers have diameters presently as large as 12 inches, with a trend toward increasingly larger wafers. To process such wafers, progressively larger and more expensive reactive plasma systems will be required with the use of conventional plasma processing technology.

SUMMARY OF THE INVENTION

In accordance with the present invention, plasma treating to remove material from a surface (e.g., etching) or to add material (e.g., deposition or implantation) or both can be performed over large areas of substrates, such as semiconductor wafers, utilizing spatially localized micro-plasmas operating in parallel with one another. A plasma can be developed in each spatially localized region which is tailored to the plasma treatment requirements of that region, avoiding the non-uniformity of plasma treatment encountered with conventional large area plasma deposition and etching systems, while permitting specific regions of the substrate to receive selected levels of plasma treatment independently of other regions of the substrate. The invention may thus be utilized, for example, to plasma etch some regions of the substrate for longer times than other regions with resulting deeper etches in certain regions than in others, or to provide etches of particular dimensions or patterns. In plasma etching, the power density can be approximately 100 times higher than in conventional plasmas. In addition, DC power can be used to etch the substrates, eliminating the need for matching impedance networks associated with RF driven plasmas. Plasma confinement can be varied from a few tens of microns to more than a centimeter by changing operating conditions. The electrodes for the micro-plasmas may also serve to mask the etch in regions where the micro-plasma is ignited. The etch dimensions are consequently confined to the openings in the mask, allowing as precise masking of the etched areas as in conventional etching. For deposition processes, the invention may be utilized to allow plasma mediated deposit of different materials in various regions of the substrate in a pattern. For example, a plasma may be established at certain of the spatially separated regions of the substrate while a first precursor gas is supplied to the region, and then a plasma may be established in other regions of the substrate while a second precursor gas is supplied, allowing multiple plasma deposition processes to take place without requiring separate lithography masks or removal or replacement of masks.

In the present invention, a plasma generating electrode is positioned closely adjacent to an exposed surface of the substrate, such as above the surface or laterally spaced from the surface. A selected pressure of the gas in the region of the electrode and the substrate is established, and a voltage is applied between the electrode and the substrate to ignite a plasma in the region between the electrode and substrate for a selected period of time. The plasma is limited to the region of the electrode adjacent to the exposed surface so that the substrate is plasma treated in a pattern defined by the electrode. The electrode may be formed as separated electrode segments which are held over and spaced from the surface of the substrate so that a plasma may be established between the electrode and the substrate in the ambient gas surrounding the electrode and substrate. An electrode patterned in this manner may be selectively moved around the substrate, either continuously or stepwise, to provide patterned etching or deposition treatment of the substrate surface. A single electrode may also be used as a probe to plasma treat the substrate as the probe is moved over the surface of the substrate. The various segments of the electrode may be independently supplied with voltage so that different voltage levels may be applied between the electrodes for different lengths of time to tailor the amount of plasma etching or deposition at particular locations on the substrate. The electrode may also be formed by utilizing a dielectric layer in contact with the surface of the substrate with openings therein, with the electrode formed on the dielectric layer such that a plasma is established in the pattern of 1 openings in the dielectric layer as a voltage is applied between the electrode and the substrate. Separate electrodes which may be separately supplied with voltage may be formed at or adjacent to the various openings in the substrate to allow tailoring of the plasmas at specific regions of the substrate. The dielectric layer and electrode may be formed separately from the substrate and mounted onto the substrate at a particular position at which the plasma treatments are to be performed, removed from a position on that substrate, and then applied to a new substrate, or may be moved in a stepwise fashion from position to position about a single substrate to provide a repeated selected pattern of plasma treatment over the surface of the substrate. The dielectric layer may also be formed as a layer in situ on the substrate, with the electrode formed over it either permanently or subject to subsequent removal. The dielectric layer may be formed directly on the surface of the substrates, or a second base electrode may be formed on the substrate surface and the dielectric layer formed over it so that the plasma generation or control voltage can be applied between the upper electrode and the lower base electrode.

An electrode formed in this manner in permanent position on the substrate may be encapsulated in a casing for the substrate, e.g., a completely processed semiconductor chip, with leads extending from the electrode and the substrate to leads or pins outside the casing. Electrical voltage may then be applied selectively to the external pins at a later time to carry out additional plasma treatment, e.g., selected etching of regions of the substrate to tailor the performance of the completed packaged unit, for example, by etching to trim the resistance of a resistor on the semiconductor substrate.

In the present invention, the plasma generating electrode may be formed as first electrode on top of a dielectric layer, with a second plasma generating electrode also formed on top of the dielectric layer spaced from the first electrode by an opening in the dielectric layer. A relatively high voltage is applied between the two plasma generating electrodes to produce a plasma in the region between them. At least one control electrode may be formed on the exposed substrate surface in the region in which the plasma is generated and be biased separately from the plasma generating electrodes to control the application of the plasma to the substrate. The separate control electrode allow various areas of the substrate to be etched or deposited at different rates or for different lengths of time.

A particular advantage of the present invention is that the spacing between the electrode and the substrate may be, and preferably is, small-preferably 1000 $\mu$m or less, and preferably in the range of 0.1 to 1,000 $\mu$m-allowing relatively high electric fields to be developed between the electrode and the substrate with relatively low applied voltages. In addition, plasmas can be developed at gas pressures that are much higher than those that are required for conventional plasma processing, typically at least 1 torr, while still avoiding arcing between the electrode and the substrate. The higher operating pressures can also assist in confining the plasma volume. The higher operating pressure enabled by the use of the present invention reduces the need for expensive vacuum pumps and allows shorter processing times.

The present invention allows highly tailored microplasmas that are well suited to applications where etch rate, directionality and the like must be controlled for localized areas. The ability to separately control spatially distinct micro-plasmas operating in parallel with each other over a wafer surface allows directionality and other features of the plasma to be controlled in the localized regions. As an example, an isotropic etch may proceed in one region while an anisotropic etch is performed in another region, enhancing manufacturing throughput. Appropriate control circuitry may be utilized to control the voltages applied to electrode segments to separately modify the spatially separated microplasmas over time, allowing customization of the etch regions and permitting fabrication of features that might otherwise require hundreds of lithography steps. Such control circuitry may, if desired, be integrated on the semiconductor surface being etched, allowing an in situ selfcontrolled etch. The invention may also include circuitry for detecting the endpoint of a plasma etch or deposition process in a region and for terminating the etch or deposition when the desired endpoint has been reached.

Further objects, features and advantages of the invention will be apparent from the following detailed description when taken in conjunction with the accompanying drawings.

DETAILED DESCRIPTION OF THE INVENTION

The present invention may be implemented in various embodiments to provide spatially localized regions of micro-plasmas applied to a substrate to be treated. In the present invention, a plasma generating electrode is positioned closely adjacent to an exposed surface of the substrate. The application of a voltage between the electrode and the substrate in the presence of a selected gas at an appropriate pressure establishes a localized plasma in the region of the electrode and the adjacent exposed substrate in the pattern of the electrode. As used herein, the "substrate" may include a plurality of layers, including a base layer such as a semiconductor wafer, and other layers on the base layer. Examples of substrates with which the invention may be utilized include single crystal silicon, gallium arsenide, and other semiconductors, but the invention is not limited to semiconductors and may be used with any other materials that are to be plasma treated. Plasma treatment includes processes in which material is removed from a surface, such as surface roughening and etching, and processes in which material is added to a surface, such as deposition and implantation.

Figure 1:
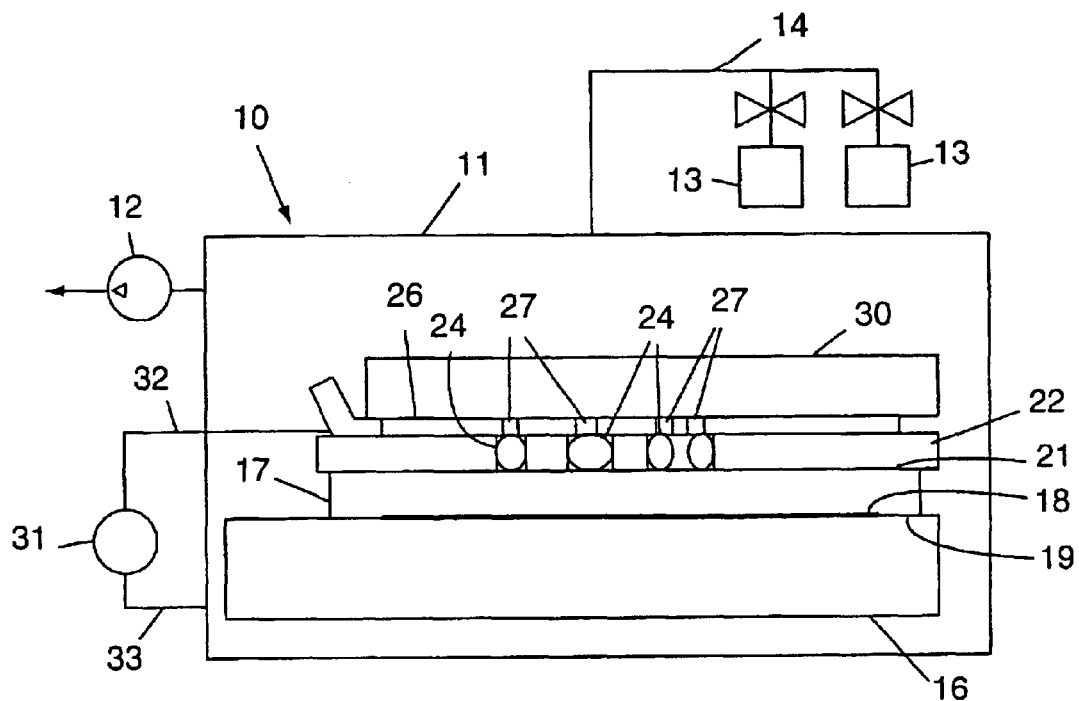
FIG. 1 is a simplified cross-sectional view of apparatus for micro-plasma treatment in accordance with the invention utilizing an electrode patterned with a dielectric layer.

The plasma generating electrode in accordance with the invention may be formed in various ways. One exemplary embodiment is illustrated with respect to the micro-plasma treatment apparatus shown generally at 10 in FIG. 1. The apparatus 10 includes a vacuum chamber enclosure 11, a vacuum pump 12 coupled to the enclosure, and gas sources 13 connected to supply reactant gas through valves and a line 14 to the vacuum chamber enclosure 11, all of which may be of standard construction for plasma processing equipment. Within the enclosure 11 is mounted a conductive support plate 16 (e.g., of aluminum) on which is mounted a substrate 17 (e.g., a wafer of single crystal silicon) which is preferably in electrically conductive contact with the plate 16 (if desired, the electrical contact may be enhanced by utilization of a metal contact layer 18 in contact with the bottom surface 19 of the substrate 17 and with the conductive plate 16). The substrate 17 has a top surface 21 opposite to the surface 19 which is in contact with the electrical conductor. The top surface 21 of the substrate is the surface to which plasma treatment is to be applied. A dielectric spacer layer 22 is mounted on the surface 21 in close contact therewith. The dielectric layer 22 has at least one opening 24 and preferably a pattern of openings formed therein which extend through the dielectric layer and which leave exposed the surface 21 of the substrate at the openings. The openings 24 define the spatially localized regions at which plasma treatment is to be applied to the exposed surface of the substrate. A patterned plasma generating electrode 26 is applied over the dielectric layer 22 and may itself have openings 27 formed therein which correspond to the openings 24 in the dielectric layer (although they may be smaller than the openings in the dielectric layer as illustrated in FIG. 1). An insulating confinement layer 30 (e.g., of glass) is mounted over the electrode 26 to seal off the openings 27 in the electrode and the corresponding openings 24 in the dielectric layer. A power supply 31 is connected by electrical conducting lines 32 to the electrode 26 (which may be formed of a conductive metal such as copper or aluminum, etc.), and by a conducting line 33 to the conductive plate 16. The power supply 31 constitutes a voltage source which applies a voltage to the electrode 26 and the conductive plate 16, and thereby to the substrate 17, to apply a voltage between the substrate 17 and the electrode 26. To initiate processing, the pump 12 is operated to exhaust ambient gases from the chamber 11 and reduce the pressure in the chamber to a base level, after which the desired reactive gas or gases are supplied from the sources 13 to the chamber 11 until a selected pressure level in the selected gas is reached in the chamber.

The application of a voltage between the electrode 26 and the substrate 17 ignites a plasma which is established in the regions defined by the openings 24 in the dielectric layer 22. Depending on the reactive gas that is provided from the sources 13 to the vacuum chamber, the plasma in the localized regions in the openings 24 may either etch the exposed surface of the substrate 17 or deposit material onto the surface from the reactive gas. The result is treatment of the substrate in a pattern defined by the pattern of exposure of the substrate to the electric field from the electrode portions spaced closely adjacent thereto. In the embodiment of FIG. 1, the patterning of the plasma generating electrode is determined by the pattern of openings 24 in the dielectric layer 22, which thereby determines the pattern in which the electric field between the electrode and the substrate ignites and establishes a plasma that contacts the exposed surface of the substrate in a corresponding pattern. The openings 27 in the electrode 26 that are illustrated in FIG. 1 facilitate examination and monitoring of the plasma treatment from a position outside the chamber 11 through a window (not shown) in the chamber, since the plasmas confined in the openings 24 emit visible light. However, the openings 27 in the electrode may be eliminated and a continuous electrode used, if desired, that spans over the openings 24 in the dielectric layer. Ingress and egress of reactant gases to and from the openings 24 in the dielectric layer 22 may be obtained through laterally extending micro-channels in the dielectric layer (not shown), by leakage between the insulating cover 30 and the surface of the electrode 26, or by perforations (not shown) in the insulating cover that lead to its upper surface.

Figure 2:
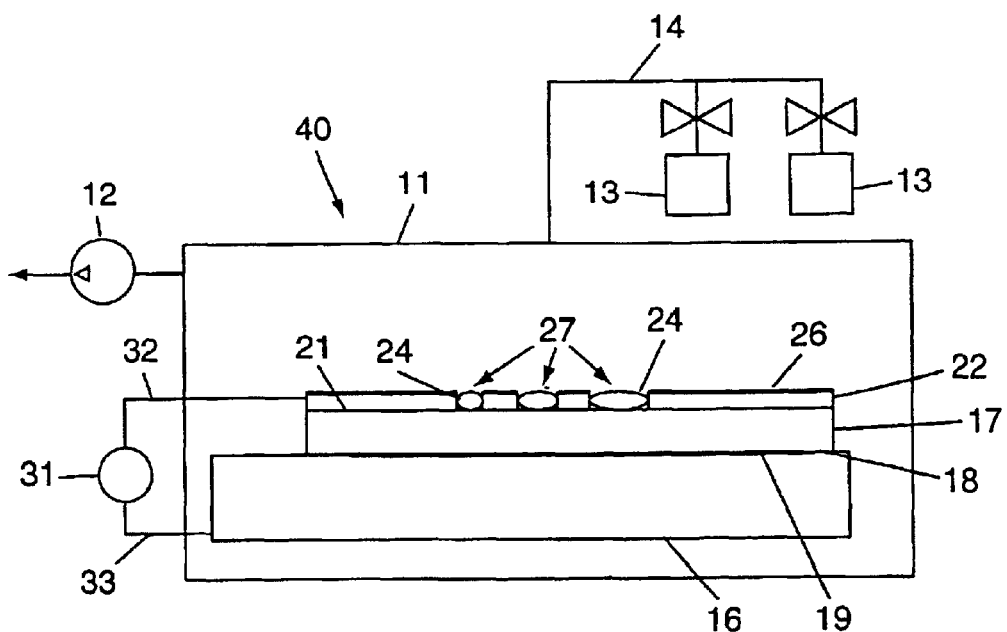
FIG. 2 is a simplified cross-sectional view of another apparatus for micro-plasma processing in accordance with the invention in which a dielectric layer is formed in situ on the surface of a semiconductor wafer.

Utilization of the insulating cover 30 is not essential, and the formation of patterned regions of micro-plasma in accordance with the invention may be carried out without it, as illustrated by the apparatus 40 in FIG. 2. In the micro-plasma treatment apparatus of FIG. 2, the openings 24 in the dielectric layer 22 are exposed to the gas within the chamber 11 through the openings 27 in the electrode 26. The openings 27 in the electrode 26 may be formed smaller than the underlying openings 24 in the dielectric layer or, as shown in FIG. 2, may coincide with the underlying openings. The dielectric layer 22 may be formed in situ of a thin layer of insulating polymer material (e.g., polyimide spun on and cross-linked) with the electrode 26 formed as a metal layer (e.g., nickel) deposited on the insulating layer in a manner conventional in semiconductor processing, with the openings 24 and 27 formed by masking and etching steps in a conventional manner. The electrode 26 is thus patterned to correspond to the openings 24 in the dielectric layer 22 to thereby provide a patterned electric field between the electrode and the exposed surface of the substrate in the regions defined by the openings 24, and thereby to ignite and establish a plasma in the reactive gas in these regions.

Figure 3:
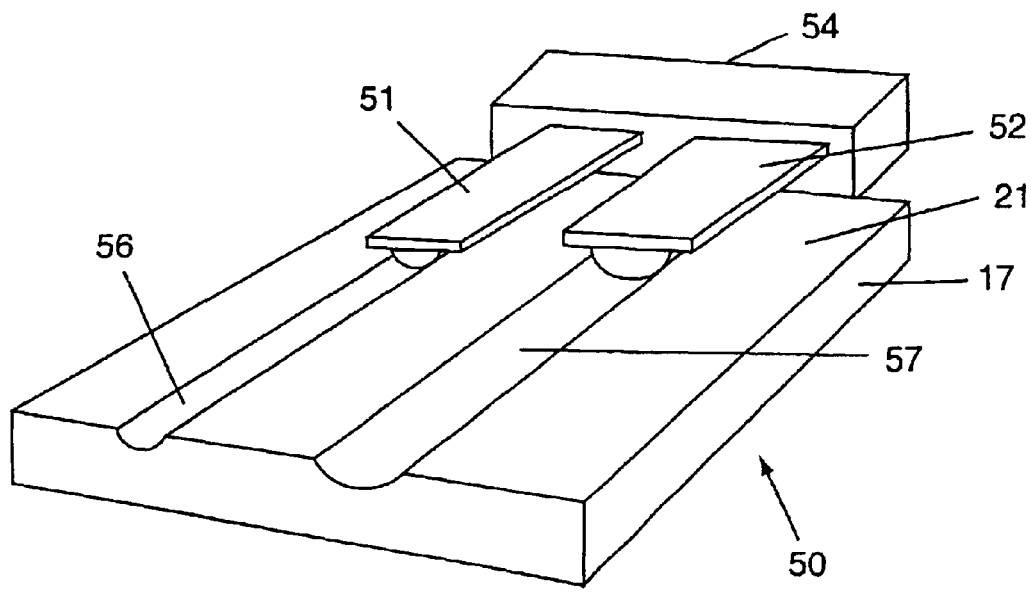
FIG. 3 is a perspective view of a plasma generating electrode in accordance with the invention mounted to carry out continuous tailored etching of the surface of a substrate.

A further embodiment of the invention is illustrated at 50 in FIG. 3. For purposes of illustration, the conductive plate 16 underlying the substrate 17, the vacuum chamber enclosure 11, the vacuum pump 12, the sources 13, and the power supply 31 and conductive connectors 32 and 33 of FIGS. 1 and 2 are not shown in FIG. 3, but may also be utilized for this apparatus. In the apparatus 50, the patterned plasma generating electrode comprises two separated electrode elements 51 and 52 which are supported in cantilevered fashion over the top surface 21 of the substrate by a holder 54. The holder 54 may be movable to support the electrode segments 51 and 52 for relative motion with respect to the surface of the substrate 16. The electrode segments 51 and 52 preferably have a flat bottom surface (and may be flat plates as shown) which can be positioned closely adjacent and parallel to the substrate surface 21. A reactive gas is supplied to the region of the electrode segments 51 and 52 and the substrate 17 and a voltage is applied between the electrode segments 51 and 52 and the substrate to establish a plasma between the electrode segments and the substrate. The voltage may be applied to the electrode segments 51 and 52 by a single voltage source at a single voltage level, or different voltages from multiple voltage sources (or the use of voltage dividers to provide multiple voltage sources from a single power supply) may be supplied to the electrode segments 51 and 52 to select the voltage that is applied between each electrode segment and the substrate. By appropriately selecting the size of the electrode segments 51 and 52, their spacing from the underlying surface 21 of the substrate, and the voltage applied to the electrode segments, the type of treatment that is carried out may be tailored, e.g., by operating the electrode segment 51 to carryout an anisotropic etch in a trench 56 while operating the electrode segment 52 to carry out an isotropic etch to form a trench 57 at the same time. The holder 54 provides a means for moving the patterned electrodes 51 and 52 with respect to the substrate to provide a selected etch pattern in the underlying substrate. A single electrode element 51 or 52 may also be used to function as a "probe" to etch or deposit in a desired pattern over the surface of the substrate. Further, an electrode of the type 51 or 52 may be used closely spaced from the surface, as discussed below, to plasma treat an entire substrate or a portion of it that has a conventional plasma masking layer applied thereto, with higher operating pressures than are permitted with conventional plasma processing.

Figure 4:
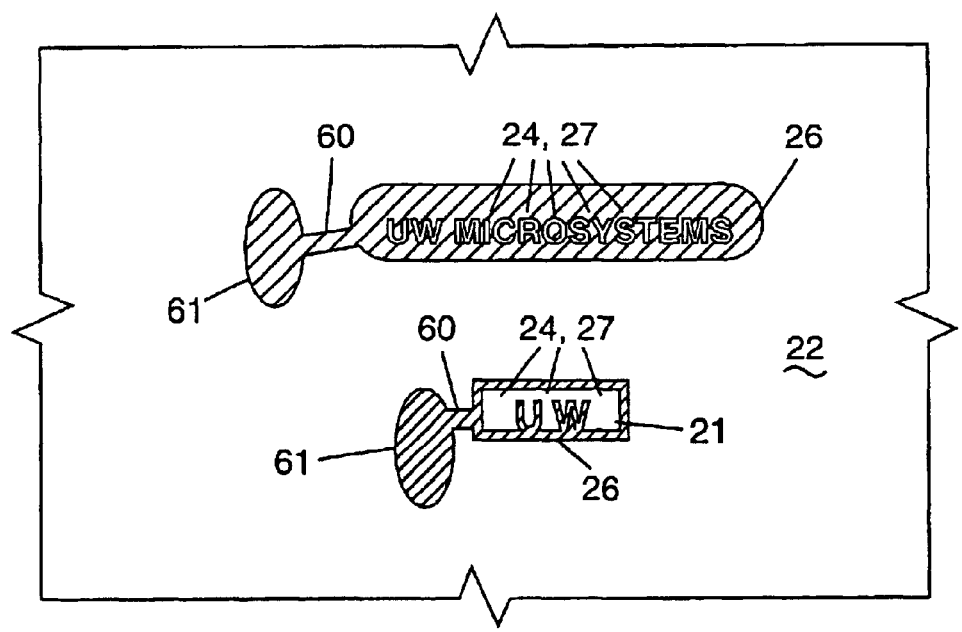
FIG. 4 is an exemplary layout of an electrode pattern which may be utilized in the invention.

FIG. 4 is an illustrative plan view of two patterned plasma generating electrodes of the type 26 shown in FIG. 2 which are formed on the surface of the dielectric layer 22. Each of the patterned electrodes 26 is formed as a layer of metal on the surface of the dielectric 22, with the coinciding openings 24 and 27 in the dielectric layer 22 and the electrode 26, respectively, exposing the surface 21 of the underlying substrate. A lead segment 60 extends from each of the patterned electrodes to a connecting pads 61 to which the electrical leads 32 may be connected. When voltage is applied to the pad 61 under the appropriate reactive gas pressure conditions, a plasma will be established adjacent to the electrodes 26 both above the electrodes and in the regions of the openings 24 and 27. In the regions 24 and 27, the underlying surface 21 of the substrate is thus exposed to the plasma, while the surface areas of the substrate outside the boundaries of the patterned electrodes 26 shown in FIG. 4 are covered by the dielectric layer 22 and thus protected from the plasma.

A particular advantage of the present invention is that the regions at which the micro-plasmas are formed are preferably relatively small in comparison to conventional plasma processing systems. The micro-plasmas obtained in accordance with the invention thus allow plasma deposition or implantation with finely controlled detail for applications such as semiconductor manufacturing. In addition, because of the small spacing between the electrode elements and the in exposed surface of the substrate, relatively low voltage levels (conditioned on the geometries of the cavities) are required to establish the plasma and much higher pressures in the vacuum chamber may be utilized while avoiding arcing. In the present invention, typical preferred spacing of the patterned electrode from the adjacent exposed substrate surface is in the range of 0.1 to 1,000 μm. Particularly with in situ dielectric and electrode layers as shown in FIG. 2, preferred spacings can be 50 μm or less. The lateral dimensions of the exposed surface features of the substrate which are plasma treated may also be in the same size range, although larger and smaller dimensions may also be utilized. Typical suitable operating pressures are in the range of 1 to 1,000 torr, three to four orders of magnitude higher pressures than can be used under conventional plasma processing conditions. In accordance with the invention, the plasma generating electrode (specifically its bottom surface) is positioned very close to the surface to be treated. It is found that at a spacing in the range of 1000 μm and less, the gas pressure required to initiate the plasma increases (significantly above the pressures that are used in conventional plasma processing) but arcing does not occur at the relatively low voltage levels (including DC voltages) at which the plasma will be ignited. The small spacing between electrode and substrate permits small, localized plasmas to be formed to provide fine detail patterned plasma treatment as discussed above. However, the invention may also be used to plasma treat a large area with a single large electrode spaced closely adjacent to a substrate with a patterned mask thereon, while operating at relatively high gas pressures. The size of the plasma treatment pattern also affects the operating pressures that are used. The size of features may be limited by the mean free path of the gas atom, requiring smaller features to be run at higher pressures. The Debye length, a function of the physical distance required for a plasma to shield charges, may constrain the minimum dimensions. It is generally considered that a plasma must be several times larger than the Debye length.

Various power supplies 31 may be utilized to apply a suitable voltage between the electrode and the substrate. Plasmas may be ignited utilizing any convenient and appropriate voltage drive, including DC and switched DC voltages, and AC voltages including radio frequency (RF), pulsed RF, and combinations.

With respect to the illustration of FIG. 2, it is noted that the substrate 17 may comprise a semiconductor chip which is encapsulated within a casing 11 in a conventional manner, with the conducting lines 32 and 33 extending out from the casing 11 as lead pins to which an external power supply 31 may be connected at a later time after the semiconductor has been completely processed. Electrical connection may be made to the semiconductor (e.g., silicon) base substrate 17, rather than through an underlying conductive plate 16 as shown in FIG. 2. In this manner, a completely packaged semiconductor chip may be encapsulated with a reactant gas such that selective plasma etching or deposit may be carried out on the completed and packaged integrated circuit for various purposes, such as selective etching of a resistor channel to trim the resistance to a precise value, or to individually compensate micromachined resonant gyroscopes for package stresses by altering resonator mass.

Various source gases may be used as in conventional plasma processing. Common gases used for plasma etching include nitrogen, oxygen, argon, sulfur hexafluoride, chlorine and various chlorofluorocarbons, although it is understood that any of the gases used in normal plasma processing may be utilized for micro-plasma processing in accordance with the invention. Gases and techniques typically used in conventional plasma deposition may also be utilized. For example only, two deposition processes which may be used in the present invention are plasma enhanced chemical vapor deposition (PECVD) and sputtering. Sputtering is achieved by bombarding a target with energetic ions from a plasma. The plasma is generally formed in an "inert" gas that does not chemically react with the target, with nitrogen and argon being commonly used. Atoms of the target are knocked off and deposited on the substrate being coated. Conductors can be sputtered with a DC plasma, as there is a conductive path to ground. Insulating targets will charge up, so an AC source, such as at radio frequencies, is typically used. Typical metals sputtered are aluminum, tungsten, titanium, and chromium, typical semiconductors are silicon and germanium, and typical insulators are silicon dioxide and aluminum oxide. Virtually any element or compound can be sputtered.

Chemical vapor deposition (CVD) relies on a chemical reaction taking place. CVD occurs at the substrate either by thermal decomposition or the reaction of two or more gases. PECVD has the advantage of adding energy to the system, to increase the reaction rates, without adding appreciable temperature, and thus it is particularly advantageous as a low temperature process. Typical semiconductor materials that are PECVD deposited are silicon, silicon dioxide, silicon nitride, and various metals. Examples of gases used in PECVD are silane ($SiH_4$) for deposition of silicon, silane and oxygen for deposition of silicon dioxide, phosphine ($PH_3$) and oxygen for deposition of phosphorous doped oxide, silane and ammonia for deposit of silicon nitride, etc. When carrying out deposition, the electrode materials should be chosen to avoid contaminating the deposition and to account for chemical considerations. The substrate is typically heated for a deposition, and this may be done locally using patterned electrodes.

The source gases from the sources 13 may be applied in a desired sequence to the containment chamber 11 to carry out a series of processing steps without moving the substrate from its mount. The chamber may simply be evacuated to a base level between each processing step before the next source gas is supplied to the chamber. For example, if a particular semiconductor structure requires successive thin films of materials "A," "B" and "C" to be deposited in separate areas or in multiple layers, the present invention allows such processing to be carried out without any masking steps by selectively exciting a micro-plasma over each desired region while precursor gases for the materials A, B or C, respectively, are flowing. Processing in this manner eliminates the multiple masking steps that are required by conventional lithography based manufacturing methods.

Although the present invention may be utilized with conductive substrates, such as doped silicon and other doped semiconductors, to facilitate application of a voltage between the patterned electrode and the substrate surface, the invention is not so limited and may be carried out with insulating substrates. An exemplary embodiment of the invention which may be utilized with either insulating or conductive substrates is illustrated generally at 70 in FIG. 5. The exemplary structures shown in FIG. 5 that are the same as in the apparatus of FIG. 2 are similarly numbered in FIG. 5 (the vacuum chamber enclosure 11, pump 12, gas sources 13, and supply line 14 are not shown for simplification). In the micro-plasma processing apparatus of claim 5, a thin film of conductive material 71 (e.g., a conducting metal such as nickel or copper) is applied to the top surface 21 of the substrate 17 and is patterned with openings 72 which correspond to the openings 24 in the dielectric layer 22. The substrate 17, which can be either conducting or non-conducting, is mounted on a chuck 73. The chuck 73 may be an insulator or have an insulating layer thereon. The voltage from the voltage source 31 is connected through the leads 32 and 33 to the first or upper plasma generating electrode 26 and the lower or second electrode 71, respectively, to apply a voltage between the electrode 26 and the exposed surface 21 of the substrate at the openings 24. With this configuration, the voltage source 31 may be a DC voltage source to apply a DC voltage to ignite the plasma in the exposed regions of the substrate defined by the openings 22 in the dielectric layer and the openings 27 and 72 in the electrodes 26 and 71, respectively. In this manner, etching or deposition treatment of surfaces of the substrate 17, which can be either insulators (e.g., glass or ceramics) or poor conductors such as undoped semiconductors, can be readily carried out, with the same advantages of the present invention as described above.

Figure 5:
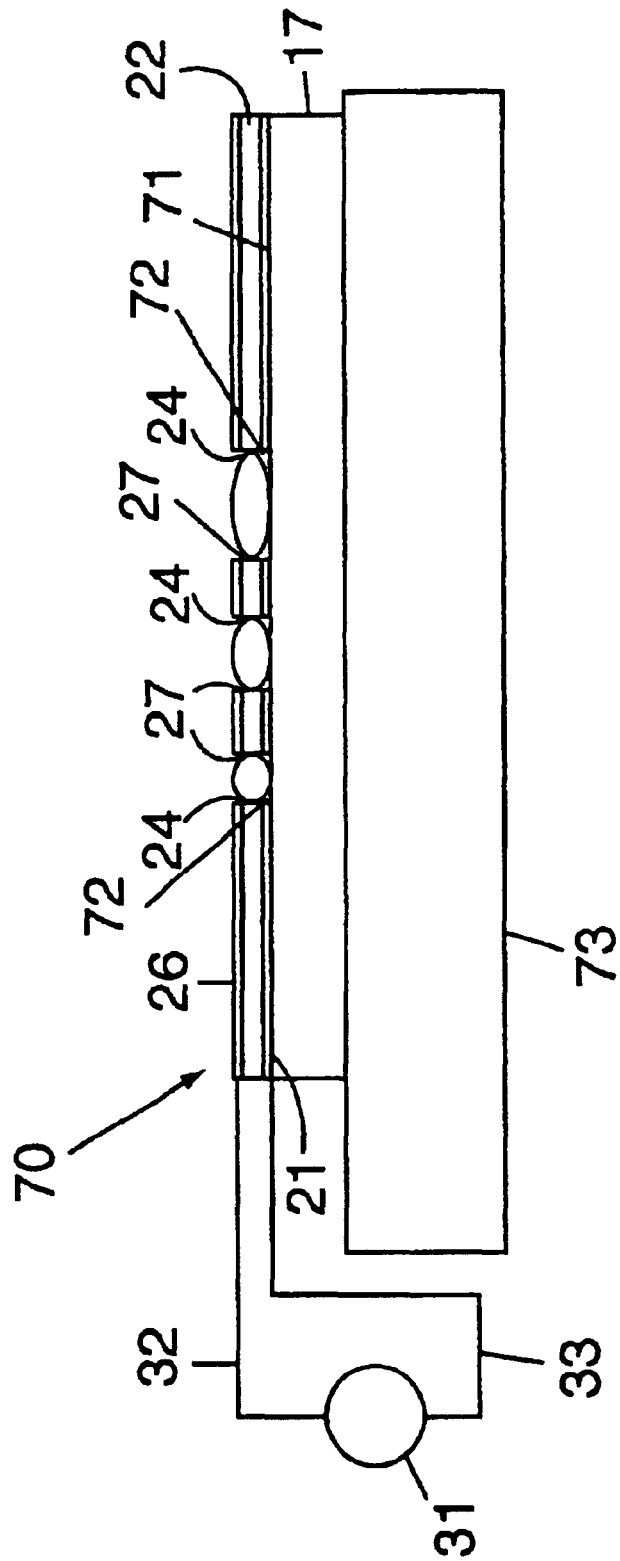
FIG. 5 is a simplified cross-sectional view of a further apparatus for micro-plasma processing in accordance with the invention.
Figure 6:
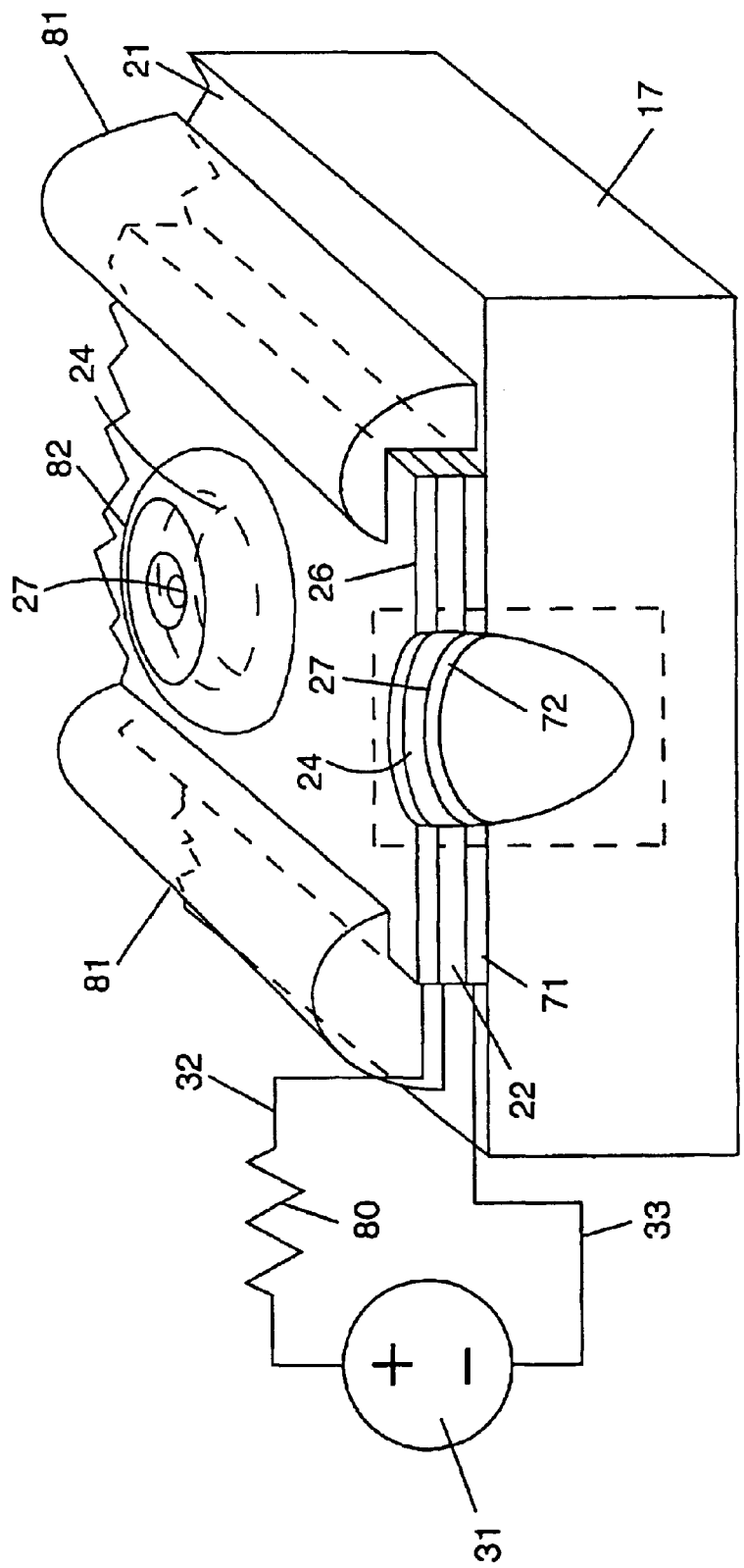
FIG. 6 is a simplified perspective view of apparatus for micro-plasma processing in accordance with the invention of the type shown in FIG. 5.

As an example of the implementation of the apparatus 70 of FIG. 5, samples can be formed as shown in FIG. 6 by a two-mask process sequence. First, a metal electrode-polyimide dielectric-metal electrode stack is deposited on a silicon wafer forming the substrate 17. The first lithography mask is used to pattern the upper metal layer 26 and the polyimide dielectric layer 22. The second mask is then used to pattern the lower metal layer 71 and simultaneously re-pattern the upper metal layer 26 as well. The metal layers 26 and 71 may be formed of various conducting metals, including chromium, aluminum, titanium, and nickel. Following the micro-plasma etch, the electrode stack can be stripped by sacrificing the lower metal electrode 71 in the appropriate wet etchant. As shown in FIG. 6, electrical power may be supplied to the metal layers 26 and 71 utilizing pads for the two in situ electrodes 26 and 71, which are contacted by probes and connected to 9, the DC power supply 31 through a series ballast resistor 80 which allows control over the plasma current. As shown in FIG. 6, the upper electrode 26 serves as the anode and the lower electrode 71 serves as the cathode. The lower electrode, which may be connected to ground, attracts the positive ions in the plasma toward the substrate 17, e.g., a silicon wafer. Typical bias voltages from the DC power supply 31 range from 300 to 600 volts, depending on the ambient gas used and the target etch rate. Typical thicknesses of the dielectric layer 22, and thus the spacing between the electrode 26 and the substrate surface, is in the range of 1000 μm or less. The silicon wafer 17 is shielded from the electric field by the grounded cathode layer 71. The relatively small electrode areas for in situ micro-plasmas in accordance with the invention allow power densities in the range of 1 to 10 $W/cm^2$ to be achieved without drawing high currents.

Relatively high operating pressures, e.g., 1–20 torr, may be used to spatially confine the plasma, permitting several micro-plasmas with different etch characteristics to operate simultaneously on a single wafer. The formation of localized micro-plasmas is illustrated in FIG. 6 by localized plasmas 81 which form at the edges of the multi-layer sandwich formed by the layers 26, 22 and 71, and by the plasma shown at 82 formed adjacent to the openings 24 and 27 in the dielectric layer 22 and the upper electrode layer 26, respectively. As used herein, the edges of the electrodes 26 and 71 and the dielectric 22 also define an "opening" in these structures which exposes the substrate surface and at which a micro-plasma 81 can be formed to treat the adjacent exposed surface. As illustrated in FIG. 6, the micro-plasmas 81 and 82 generally can be formed to be spatially separated from one another and thus act independently on the underlying substrate 17. In one example of application of the present invention, the ambient gas used was $N_2$, with a bias voltage of −360 V, which is the opposite polarity to the bias normally used for etching. By varying the power supplied by the DC voltage supply 31 and the gas pressure, the plasma confinement can be changed from less than 100 µm to greater than 1 cm. Other samples were obtained utilizing $SF_6$ as the gas in which the plasma was ignited. Using this gas and performing etching through openings in the in situ electrodes, etches were obtained of a 92 tun deep etch through a circular opening of 150 µm diameter and a silicon substrate, achieved in 20 minutes at 2.7 torr, with a power density of 3.2 W/cm$^2$ averaged over the electrode area. The resulting sidewall angle was 22° off vertical. The electrode metal layers were formed of aluminum. In another example, a 233 µm deep etch was achieved in 50 minutes using the same parameters. A 33 µm deep etch through a 50 im diameter opening was achieved in three minutes at 2.9 torr and 7.3 W/cm$^2$. The sidewall angle was found to be nearly vertical in certain locations of the profile. Aluminum was also used as the electrode metal. A 207 µm deep etch was made through a 280 µm wide, 2.2 mm long slit opening, using metal electrodes formed of titanium. The etch was achieved in 24 minutes at 5.2 torr and 6.8 W/cm$^2$. The sidewall angle for this etch was also found to be nearly vertical in certain locations of the profile. It was found that varying degrees of anisotropy can be achieved by changing the operating conditions of the micro-plasmas. The etch rate of silicon and SF, micro-plasmas was also studied as a function of several operating parameters. Etches were performed under two sets of conditions: the first set used 2.7 torr pressure, 1.6 W/cm$^2$ power density and aluminum electrodes with circular openings of 350 µm diameter, and a second set used 5.2 torr, 6.8 W/cm$^2$, and titanium electrodes with 280 µm wide slit openings. In the first case etch rates of 4 to 7 µm/per minute were obtained, while in the second case etch rates of 9 to 12 µm/minute were obtained. In both cases, the etch rate was significantly higher for the first few minutes of the plasma treatment and then rapidly settled at a lower value that was stable for 50 minutes. One factor which may contribute to the higher initial etch rate is that the electric field above the exposed silicon is highest for the first few minutes of an etch, during the time that the etched depth is relatively small. For the second set of conditions, it was possible to etch through a wafer in less than an hour. Through wafer etches were readily achieved with the use of titanium electrodes, which developed considerably less damage than aluminum from sputtering in exposed regions of a cathode, consistent with results seen in conventional etchers. From etches performed for three minutes at 2.7 torr using aluminum electrodes with circular openings to 350 µm diameter, it was found that the etch rate increases linearly with power density over a range of electrode power from about 1 W/cm$^2$ to about 7 W/cm$^2$. The highest etch rate achieved was 17.4 µm/minute. The relatively high etch rates are facilitated in part by the high power densities. Since the electrode area for micro-plasmas in accordance with the invention is generally much less than 1 cm$^2$, such power densities can be achieved at moderate current levels.

Sample etches were evaluated as a function of chamber pressure for three minute long etches performed through a 280 µm wide slit opening in titanium electrodes. As the pressure is increased, the power necessary to sustain the plasma was found to increase from 3 to 7 W/cm$^2$, with the ratio of the etch rate to power density increasing from 0.15 to 4.23 µm/minute per W/cm$^2$ as the pressure is changed from 2 to 20 torr.

Figure 7:
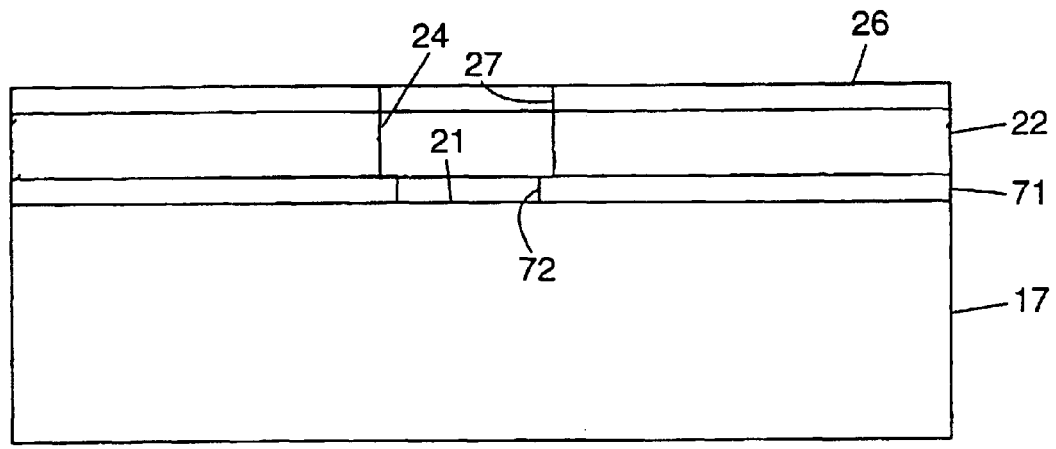
FIG. 7 is a further simplified cross-sectional view of a portion of the micro-plasma processing structure of FIG. 6 illustrating a single opening in the cathode layer under the opening in the plasma generating electrode anode layer.
Figure 8:
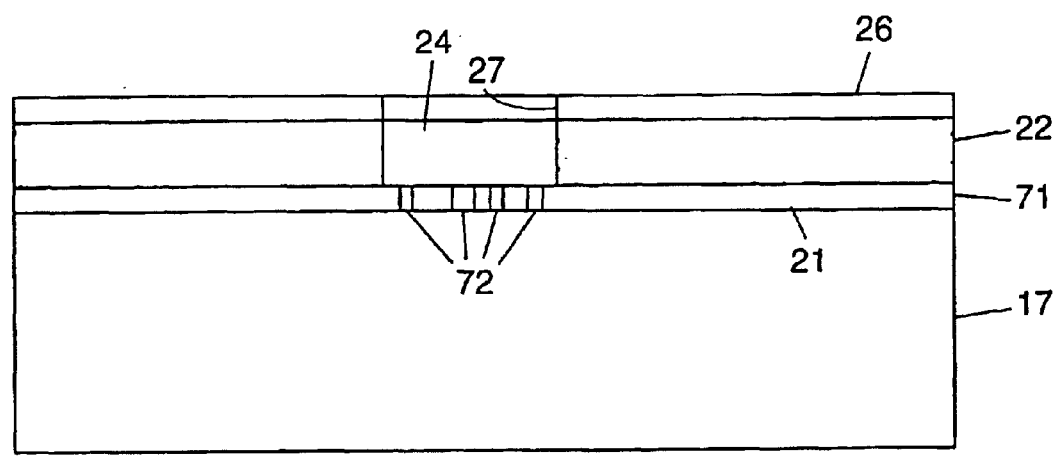
FIG. 8 is a simplified cross-sectional view of the multilayer structure of FIG. 6 illustrating the invention embodied with multiple openings in the cathode layer under a single opening in the anode layer.

As illustrated in the simplified cross-sectional view of FIG. 7, a single etch pattern may be formed utilizing an opening 72 in the bottom electrode layer 71 which is substantially the same size as and generally conforms to the opening 24 in the dielectric layer 22 and the opening 27 in the electrode 26. The exposed surface 21 of the substrate 17 will thus be plasma etched in the entire area of the opening 72. It is not necessary that the opening 72 in the lower electrode (cathode) 71 conform to the openings 24 and 27, or that it even be a single opening. As illustrated in the cross-sectional view of FIG. 8, the lower electrode 71 may have multiple openings 72 or may have a pattern of an opening or openings which does not generally conform to the area of the openings 24 and 27 in the dielectric layer and upper electrode. The metal of the cathode electrode layer 71 forms a barrier that masks the areas underneath the layer from the local micro-plasma which has access to the surface 21 of the substrate only through the opening(s) 72. This arrangement, which may be referred to as a shared anode configuration, is particularly advantageous as the lateral dimensions of the etch, and thus of the openings, become smaller (e.g., very narrow trench widths), because it is easier to fabricate an electrode arrangement in which the lower metal electrode 71 by itself is patterned with the finer pattern of opening(s) 72 than it would be to form similar fine patterns of openings in both the upper electrode 26 and the dielectric layer 22. The variation of etch rates with lateral dimensions of the mask opening was explored with the shared anode configuration of FIG. 8. The openings 72 in the lower electrode 71 were 1.75 mm long and ranged in width from 106 µm to 5.6 µm. Three minute etches were performed at 7.2 W/cm$^2$ power density. A 95% reduction in slit width is found to be related to a 14% monotonic reduction in etch rate.

In plasmas that have a power density that is conventionally used for semiconductor processing, ion-electron pairs are vastly outnumbered by neutral species. As a consequence, when the applied voltage is increased, the energy increase results in appreciably more electron-neutral collisions that electron—electron collisions. This results in increased plasma density but does not substantially increase the electron temperature. The higher plasma density then results in larger plasma current, which is observable as a drop in plasma resistance with an increase in the power density. Measurements were made for various electrode power density levels over the range 1–7 W/cm$^2$ at 2.7 torr using thin film aluminum electrodes of 0.2 cm$^2$ area to determine the measured resistance of the micro-plasmas as a function of power density. The plasma resistance was found to decrease with increasing power density.

Figure 9:
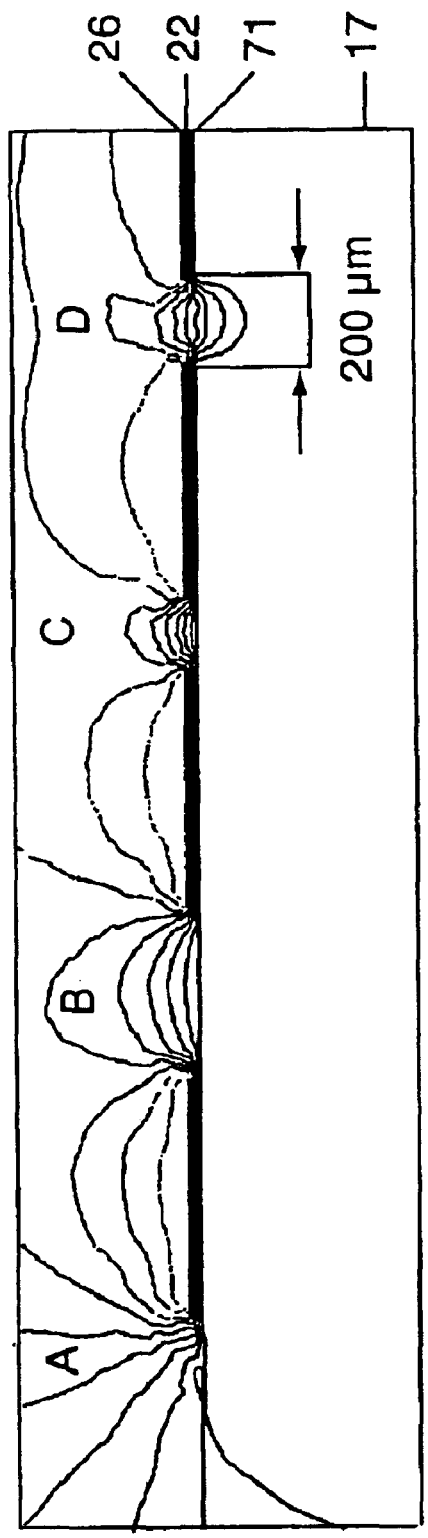
FIG. 9 is a schematic view illustrating the equipotential contours for a structure as in FIG. 7 showing variations of the local electric field with openings to the substrate of varying widths (openings A, B, C) and with etch progression (opening D).

Under the conditions described above, etching is believed to be performed by ions which are pulled away from the sheath that exists above the electrode stack by the electric field associated with the openings in the stack. Results from preliminary modeling of the electric field are illustrated in FIG. 9. These calculations of the electric field were performed using MAXWELL™ software, and neglect the conductivity and charge distribution of the plasma, under assumed conditions of openings of various widths in a 30 µm thick metal-polyimide-metal electrode stack on a 500 µm thick silicon wafer, with the relative dielectric constant of the polyimide being 3.5 and the resistivity of the metal being zero. FIG. 9 shows equipotential contours which are crowded progressively closer together in the progressively narrower openings marked A, B and C, suggesting that the electric fields are higher over narrow openings, while the local electric field extends to greater heights above the wider gaps. The difference between the contours at locations C and D, which are of the same width but represent shallow and deep etches, respectively, suggest that the electric field is reduced as etch progresses. This decrease may be correlated to the observation that the initial etch rate is higher than the cumulative average rate.

Figure 10:
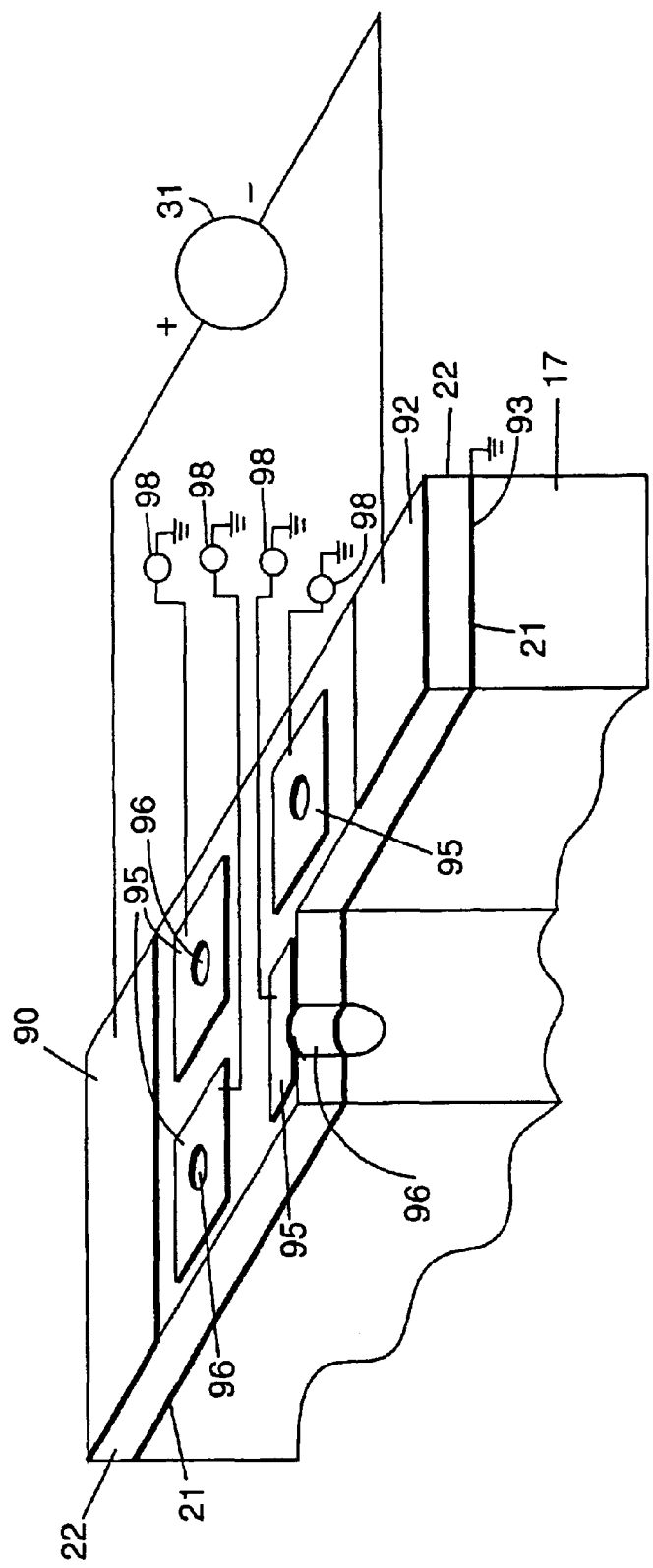
FIG. 10 is a simplified perspective view of another embodiment of a micro-plasma processing structure in accordance with the invention having independent electrodes for generating the plasma and for controlling application of the plasma to the surface of a substrate.
Figure 11:
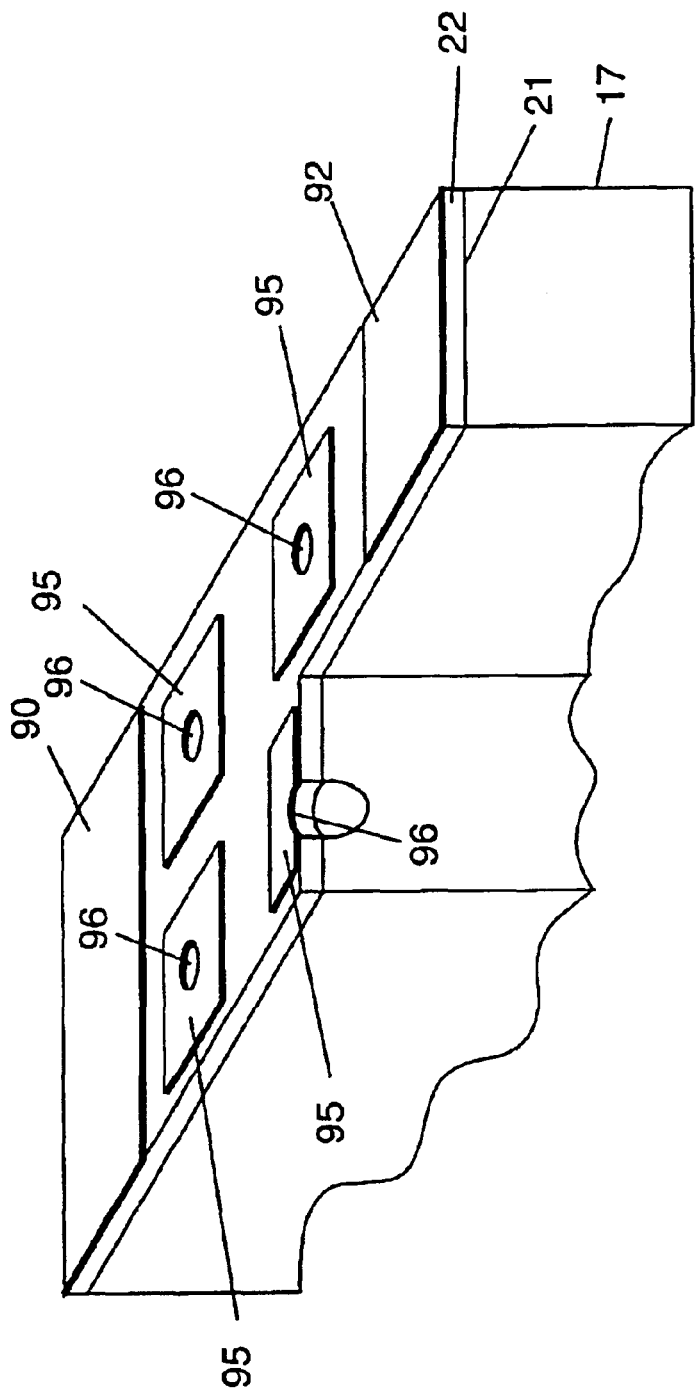
FIG. 11 is a simplified perspective view, similar to FIG. 10, illustrating the micro-plasma processing structure with separate electrodes for generating the plasma and separate electrodes for controlling application of the plasma to the substrate surface.
Figure 12:
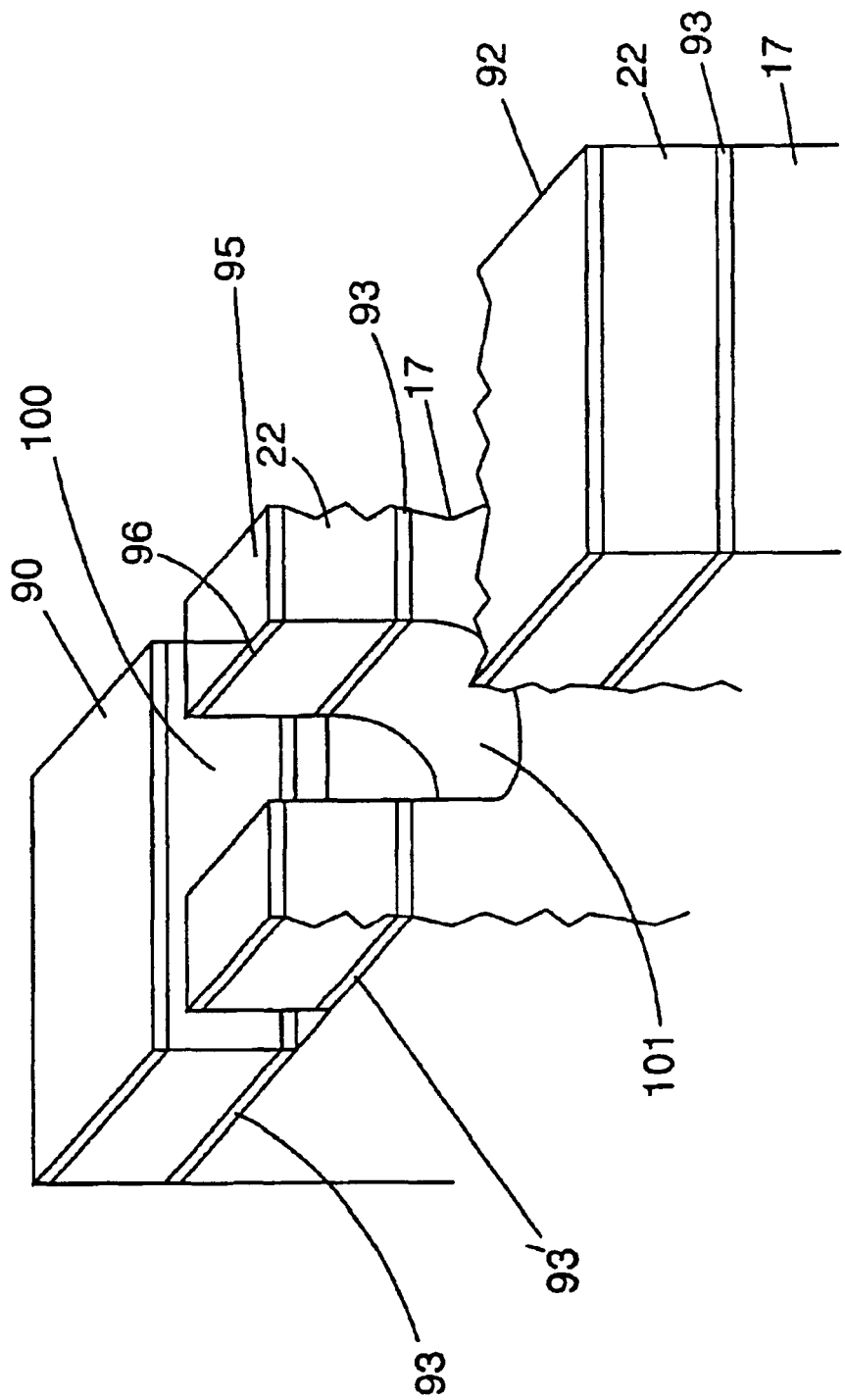
FIG. 12 is a perspective view illustrating the manner in which etch profile control may be obtained when utilizing the structures of FIGS. 10 and 11.

In the present invention, the plasma generating electrode may be used to generate a plasma which can be selectively applied to a substrate utilizing independently biased control electrodes that are electrically isolated from the electrodes that generate the plasma. Such an apparatus is illustrated in FIG. 10. A first plasma generating electrode 90 and a second plasma generating electrode 92 are formed on the top surface of an insulating dielectric layer 22, e.g., polyimide, which is itself formed on an underlying electrode 93 on the top surface 21 of the substrate 17. A DC power supply 31 is connected to apply a DC voltage between the electrodes 90 and 92 to generate a plasma in the region between the electrodes 90 and 92. The power supplied by the DC source 31 may be at a fairly high voltage level, e.g., 600 V. One or more control electrodes 95, which may be patterned with openings 96 therein, are formed on the surface of the dielectric 22 electrically isolated from each other and from the plasma generating electrodes 90 and 92. A relatively low voltage bias may be applied between the control electrodes 95 and the underlying electrode 93 (which itself may be either continuous or multiple independent electrodes) to block or pass the ion flux from the plasma in the region between the generating electrodes 90 and 92. By utilizing separate power sources 98 (or separate voltages supplied from a single source) connected to the control electrodes 95, the etch rate or total etch time at the openings 96 in the control electrodes can be selected to achieve different etch depths or contours at each control electrode opening. As illustrated in FIG. 11, the underlying electrode 93 need not be used, and the plasma generating electrodes 90 and 92 and the control electrodes 95 may be formed on the surface of a dielectric layer 22 that is applied directly to the top surface 21 of the substrate 17. Where the bottom or substrate surface electrode 93 is utilized, it may be connected to ground to provide a ground plane under each of the control electrodes 95, or the substrate surface electrode 93 may be formed of multiple independent electrodes which can be independently biased at different levels with respect to the control electrodes 95 on the surface of the dielectric. The dielectric layer 22 can be, for example only, any of the various types of dielectrics commonly used in semiconductor processing, including polyimide, oxide, nitride, etc. Because the control electrodes 95 can be biased separately and operated at relatively low voltages, while the plasma generating electrodes 90 and 92 are run at relatively high voltages, low voltage control circuits, e.g., CMOS circuitry, can be used to control the bias voltages applied to the control electrodes 95. As illustrated in FIG. 12, the biasing of the control electrodes 95 can be carried out to provide a variety of different aspect ratios during the same etch, or to improve the aspect ratio of the etches, as illustrated by the relatively shallow trench 100 between the electrode 90 and a control electrode 95 and the relatively deep trench 101 under the electrode 95 in the area of the opening 96.

It is understood that the invention is not confined to the particular embodiments set forth herein as illustrative, but embraces all such forms thereof as come within the scope of the following claims.

What is claimed is:

1. A method of plasma treatment of substrates comprising:
   (a) positioning a plasma generating electrode adjacent to an exposed surface of a substrate, wherein the plasma generating electrode comprises at least two separate electrode segments which are spaced from each other;
   (b) establishing a selected pressure of a selected gas over the plasma generating electrode and the substrate surface; and
   (c) applying a voltage to the plasma generating electrode to establish a plasma in the selected gas that is localized in a region between the electrode and the adjacent exposed surface of the substrate for a selected period of time to plasma treat the substrate, wherein the localized region in which the plasma is established is less than the entire surface of the substrate and the gas pressure established over the substrate and electrode is at least 1 torr and the electrode is positioned sufficiently close to the substrate surface that the plasma is established by applying a voltage to the electrode at a voltage level that does not result in arcing.

2. The method of claim 1 wherein, after establishing the plasma in the region between the electrode and the substrate for the selected period of time, then moving the electrode to another position adjacent to the surface of the substrate, establishing a selected gas pressure of a selected gas over the electrode and the substrate, and applying a voltage to the electrode to establish a plasma that is localized in a region between the electrode and the substrate to plasma treat the substrate wherein the localized region in which the plasma is established is less than the entire surface of the substrate.

3. The method of claim 1 wherein the electrode is positioned to be spaced within 1,000 $\mu$m of the substrate surface.

4. The method of claim 3 wherein the electrode is spaced less than 50 $\mu$m from the substrate surface.

5. The method of claim 1 wherein the plasma is established to remove material from the substrate.

6. The method of claim 1 wherein the plasma is established to add material from the plasma to the substrate.

7. The method of claim 1 wherein the plasma is established by applying a DC voltage between the electrode and the substrate surface sufficient to generate a plasma in the region between the electrode and the substrate surface without arcing and to draw positively charged ions toward the substrate surface.

8. The method of claim 1 wherein the plasma is established by applying an AC voltage to the electrode sufficient to generate a plasma in the region between the electrode and the substrate surface without arcing.

9. The method of claim 1 including the step of moving the electrode across the substrate surface while establishing a plasma between the electrode and the substrate.

10. The method of claim 1 wherein the substrate is a silicon wafer, and wherein in the step of applying a voltage to the electrode, a conductive plate is applied to the silicon wafer on a surface thereof opposite to the surface to be treated and a voltage source is connected to the electrode and the conductive plate to provide the voltage between the electrode and the substrate.

11. A method of plasma treatment of substrates comprising:
   (a) positioning a plasma generating electrode adjacent to an exposed surface of a substrate;
   (b) establishing a selected pressure of a selected gas over the plasma generating electrode and the substrate surface; and
   (c) applying a voltage to the plasma generating electrode to establish a plasma in the selected gas that is localized in a region between the electrode and the adjacent exposed surface of the substrate for a selected period of time to plasma treat the substrate, wherein the localized region in which the plasma is established is less than the entire surface of the substrate and the gas pressure established over the substrate and electrode is at least 1 torr and the electrode is positioned sufficiently close to the substrate surface that the plasma is established by applying a voltage to the electrode at a voltage level that does not result in arcing, wherein the step of positioning the plasma generating electrode comprises applying a dielectric layer having at least one opening therein on the substrate surface and applying the plasma generating electrode to the dielectric layer adjacent to the opening in the dielectric layer and adjacent to the surface of the substrate exposed by the dielectric layer.

12. The method of claim 11, further including applying a second electrode on the substrate surface, which is between the dielectric layer and the substrate surface, and the step of applying voltage comprises applying voltage between the plasma generating electrode and the second electrode.

13. The method of claim 11, including after applying a voltage to plasma treat the substrate for a selected period of time, removing the dielectric layer and the plasma generating electrode from the substrate.

14. The method of claim 11 wherein the step of removing is carried out by dissolving the dielectric layer and the electrode in liquid etchant.

15. A method of plasma treatment of substrates comprising:
（a) positioning a plasma generating electrode adjacent to an exposed surface of a substrate;
(b) establishing a selected pressure of a selected gas over the plasma generating electrode and the substrate surface; and
(c) applying a voltage to the plasma generating electrode to establish a plasma in the selected gas that is localized in a region between the electrode and the adjacent exposed surface of the substrate for a selected period of time to plasma treat the substrate, wherein the localized region in which the plasma is established is less than the entire surface of the substrate and the gas pressure established over the substrate and electrode is at least 1 torr and the electrode is positioned sufficiently close to the substrate surface that the plasma is established by applying a voltage to the electrode at a voltage level that does not result in arcing wherein positioning the plasma generating electrode comprises applying a dielectric layer to the substrate surface and applying the plasma generating electrode to the dielectric layer, and further applying another dielectric layer with a second electrode thereon to the substrate such that the second electrode is spaced from the plasma generating electrode with the exposed substrate surface lying between the electrodes and wherein the step of applying a voltage comprises applying a voltage between the plasma generating electrode and the second electrode.

16. The method of claim 15, further comprising locating an electrode layer on the substrate surface and under the dielectric layers, and electrically biasing the electrode layer to draw ions from the plasma toward the substrate surface.

17. The method of claim 15, further including applying at least one control electrode to the substrate surface between the plasma generating electrode and the second electrode and selectively biasing the control electrode to selectively attract or repel ions in the plasma.

18. The method of claim 17, wherein the control electrode has at least one opening therein that exposes the surface of the substrate to the plasmas.

19. The method of claim 1 wherein the plasma generating electrode is patterned and has at least one opening therein and wherein the exposed surface of the substrate is treated in a pattern corresponding to the patterned plasma generating electrode including the opening therein.

20. The method of claim 1 wherein the selected gas is selected from the group consisting of nitrogen, oxygen, argon, sulfur hexafluoride, chlorine, and chlorofluorocarbons to treat the exposed surface of the substrate by etching it.

21. A method of plasma treatment of substrates comprising:
(a) applying a dielectric layer on a substrate surface, the dielectric layer having at least one opening therein that exposes the substrate surface, and applying a plasma generating electrode to the dielectric layer adjacent to the opening in the dielectric layer and to the surface of the substrate exposed at the opening in the dielectric layer;
(b) establishing a selected pressure of a selected gas over the plasma generating electrode and the substrate surface; and
(c) applying a voltage to the plasma generating electrode to establish a plasma in the selected gas in a region between the electrode and the adjacent exposed surface of the substrate for a selected period of time to plasma treat the substrate.

22. The method of claim 21 wherein the plasma generating electrode comprises at least two separate electrode segments which are spaced from each other.

23. The method of claim 21 wherein the gas pressure established over the substrate and electrode is greater than 1 torr.

24. The method of claim 21 wherein the plasma generating electrode is spaced by the dielectric layer within 1,000 $\mu$m of the substrate surface.

25. The method of claim 24 wherein the electrode is spaced less than 50 $\mu$m from the substrate surface.

26. The method of claim 21 wherein the plasma is established by applying a DC voltage between the electrode and the substrate surface sufficient to generate a plasma in the region between the electrode and the substrate surface without arcing and to drawing positively charged ions toward the substrate surface.

27. The method of claim 21 wherein the substrate is a silicon wafer, and wherein in the step of applying a voltage between the electrode and the substrate, a conductive plate is applied to the silicon wafer on a surface thereof opposite to the surface to be treated and a voltage source is connected to the electrode and the conductive plate to provide the voltage between the electrode and the substrate.

28. The method of claim 21 wherein the step of positioning the plasma generating electrode comprises applying a dielectric layer having at least one opening therein on the substrate surface and applying the plasma generating electrode to the dielectric layer adjacent to the opening in the dielectric layer and adjacent to the surface of the substrate exposed by the dielectric layer.

29. The method of claim 21 further including applying a second electrode on the substrate surface, which is between the dielectric layer and the substrate surface, and the step of applying voltage comprises applying voltage between the plasma generating electrode and the second electrode.

30. The method of claim 21 including after applying a voltage to plasma treat the substrate for a selected period of time, removing the dielectric layer and the plasma generating electrode from the substance.

31. Micro-plasma treatment apparatus comprising:

(a) a substrate with a surface to be treated with a plasma;

(b) a dielectric layer mounted on the surface of the substrate and having at least one opening therein that exposes the surface of the substrate at the opening; and (c) a plasma generating electrode mounted over the dielectric layer and spaced thereby from the substrate surface such that a plasma may be established between the electrode and the exposed surface of the substrate in the opening in the dielectric layer.

32. The apparatus of claim 31 wherein the dielectric layer has a pattern of plural openings therein with the electrode extending over the openings.

33. The apparatus of claim 31 wherein the electrode has an opening therein at the opening in the dielectric layer and further including a sealing layer over the electrode that covers the opening in the electrode and the dielectric layer to confine plasma to the regions defined by the opening in the dielectric layer.

34. The apparatus of claim 31 wherein the electrode has an opening therein which coincides with the opening in the dielectric layer.

35. The apparatus of claim 31 further including a conducting plate in contact with a surface of the substrate opposite to the surface to be treated, a voltage source, and electrical connectors connected to the electrode and the conductive plate such that a voltage can be applied by the voltage source to the electrode and conductive plate to thereby provide an electric field in regions defined by the openings in the dielectric layer.

36. The apparatus of claim 31 wherein the electrode has plural separated and electrically isolated segments and including voltage sources connected by electrical lines separately to each electrode segment to apply voltage thereto separately.

37. The apparatus of claim 36 further including a conductive plate mounted in contact with a surface of the substrate opposite to the surface to be treated and wherein the voltage sources are connected to the conducting plate to apply voltages between the conducting plate and the electrode segments.

38. The apparatus of claim 31 wherein the substrate comprises a silicon wafer.

39. The apparatus of claim 31 including a DC voltage source connected to the electrode to provide a DC voltage to generate a plasma.

40. The apparatus of claims 31 including an AC voltage source connected to the electrode to provide an AC voltage to generate a plasma.

41. The apparatus of claim 31 further including a casing surrounding the substrate, dielectric layer, and electrode and sealing the same from the ambient atmosphere, and including electrical leads extending from the electrode and from electrical contact with the substrate to leads extending externally from the casing such that electrical voltage can be applied to the extending leads to selectively establish a plasma in the regions at the opening in the dielectric layer.

42. The apparatus of claim 31 including a second electrode on the substrate surface and under the dielectric layer, the second electrode having at least one opening therein at the opening in the dielectric layer such that a voltage may be applied between the electrodes to establish a plasma in the openings in the dielectric layer.

43. The apparatus of claim 42 wherein the second electrode has a plurality of openings therein at the opening in the dielectric layer.

44. The apparatus of claim 31 wherein the thickness of the dielectric layer is less than 1000 $\mu$m.

45. The apparatus of claim 31 including another dielectric layer with a second electrode thereon mounted on the surface of the substrate such that the second electrode is spaced from the plasma generating electrode with the exposed substrate surface lying between them, whereby a voltage may be applied between the plasma generating electrode and the second electrode for generating a plasma.

46. The apparatus of claim 44 including bottom electrode layers on the substrate under the dielectric layers and the plasma generating electrode and the second electrode.

47. The apparatus of claim 45 including at least one control electrode on the substrate surface between the plasma generating electrode and the second electrode and including a voltage source connected to the control electrode to selectively bias it.

48. The apparatus of claim 47 wherein the control electrode has at least one opening therein that exposes the surface of the substrate.

* * * * *